United States Patent
Kim et al.

(10) Patent No.: US 8,357,937 B2
(45) Date of Patent: Jan. 22, 2013

(54) THIN FILM TRANSISTOR LIQUID CRYSTAL DISPLAY DEVICE

(75) Inventors: Dong-Yung Kim, Gyeongsangbuk-Do (KR); Chang-Bin Lee, Busan (KR)

(73) Assignee: LG Display Co., Ltd., Seoul (KR)

( * ) Notice: Subject to any disclaimer, the term of this patent is extended or adjusted under 35 U.S.C. 154(b) by 168 days.

(21) Appl. No.: 12/000,909

(22) Filed: Dec. 18, 2007

(65) Prior Publication Data
US 2008/0237596 A1 Oct. 2, 2008

(30) Foreign Application Priority Data

Dec. 19, 2006 (KR) .................. 10-2006-0130342
Dec. 29, 2006 (KR) .................. 10-2006-0139118

(51) Int. Cl.
*H01L 29/04* (2006.01)
*H01L 31/036* (2006.01)
*H01L 31/0376* (2006.01)
*H01L 31/20* (2006.01)

(52) U.S. Cl. ........... 257/59; 257/E21.414; 257/E29.291; 349/43

(58) Field of Classification Search .................. 257/59, 257/E21.414, E29.291; 349/43
See application file for complete search history.

(56) References Cited

U.S. PATENT DOCUMENTS

| | | | | |
|---|---|---|---|---|
| 5,355,002 A | * | 10/1994 | Wu | 257/57 |
| 5,731,856 A | * | 3/1998 | Kim et al. | 349/43 |
| 7,527,994 B2 | * | 5/2009 | Sarma et al. | 438/30 |
| 7,537,973 B2 | * | 5/2009 | Chen | 438/149 |
| 2002/0048866 A1 | * | 4/2002 | Wong | 438/155 |
| 2004/0129943 A1 | * | 7/2004 | Yoo et al. | 257/72 |

OTHER PUBLICATIONS

Akiyama, M., et al., "An a-Si TFT with a New Light-shield Structure and its Application to Active-Matrix Liquid Crystal Displays", 1988, IEDM '88, p. 268-271.*

* cited by examiner

*Primary Examiner* — Howard Weiss
(74) *Attorney, Agent, or Firm* — McKenna Long & Aldridge, LLP

(57) ABSTRACT

A liquid crystal display (LCD) includes: a first substrate divided into a pixel part and first and second pad parts; a gate electrode and a gate line formed at the pixel part of the first substrate; an active pattern formed as an island on the gate electrode and having a width smaller than the gate electrode; an insulation film formed on the first substrate and having first and second contact holes exposing source and drain regions of the active pattern, respectively; source and drain electrodes formed at the pixel part of the first substrate and electrically connected with the source and drain regions of the active pattern via the first and second contact holes; a data line formed at the pixel part of the first substrate and crossing the gate line to define a pixel region; an etch stopper positioned between the source and drain electrodes and formed as an insulation film; a pixel electrode electrically connected with the drain electrode; and a second substrate attached with the first substrate in a facing manner.

6 Claims, 11 Drawing Sheets

THIN FILM TRANSISTOR LIQUID CRYSTAL DISPLAY DEVICE

This application claims the benefit of Korean Patent Applications Nos. 10-2006-0130342, filed in Korea on Dec. 19, 2006 and 10-2006-0139118, filed in Korea on Dec. 29, 2006, which are hereby incorporated by reference for all purposes as if fully set forth herein.

BACKGROUND OF THE INVENTION

1. Field of the Invention

Embodiments of the present invention relate to a display device and, more particularly, to a liquid crystal display (LCD) device and a fabrication method thereof. Although embodiments of the invention are suitable for a wide scope of applications, the embodiments are particularly suitable for simplifying a fabrication process, improving production yield, and enhancing device reliability by reducing the number of masks.

2. Discussion of the Related Art

As consumer interest in information displays is growing and the demand for portable (mobile) information devices is increasing, research and commercialization of light and thin flat panel displays ("FPD") have increased.

Among FPDs, the liquid crystal display ("LCD") is a device for displaying images by using optical anisotropy of liquid crystal material. LCD devices exhibit excellent resolution and color and picture quality, so they are widely used for notebook computers or desktop monitors, for example.

The LCD includes a color filter substrate, an array substrate and a liquid crystal layer formed between the color filter substrate and the array substrate.

An active matrix (AM) driving method commonly used for the LCD is a method in which liquid crystal molecules in a pixel part are driven by using amorphous silicon thin film transistors (a-Si TFTs) as switching elements.

In the fabricating process of the LCD, a plurality of masking processes (namely, photographing processes) are performed to fabricate the array substrate including the TFTs. Thus, a method for reducing the number of masking processes will increase productivity.

Figure 1:
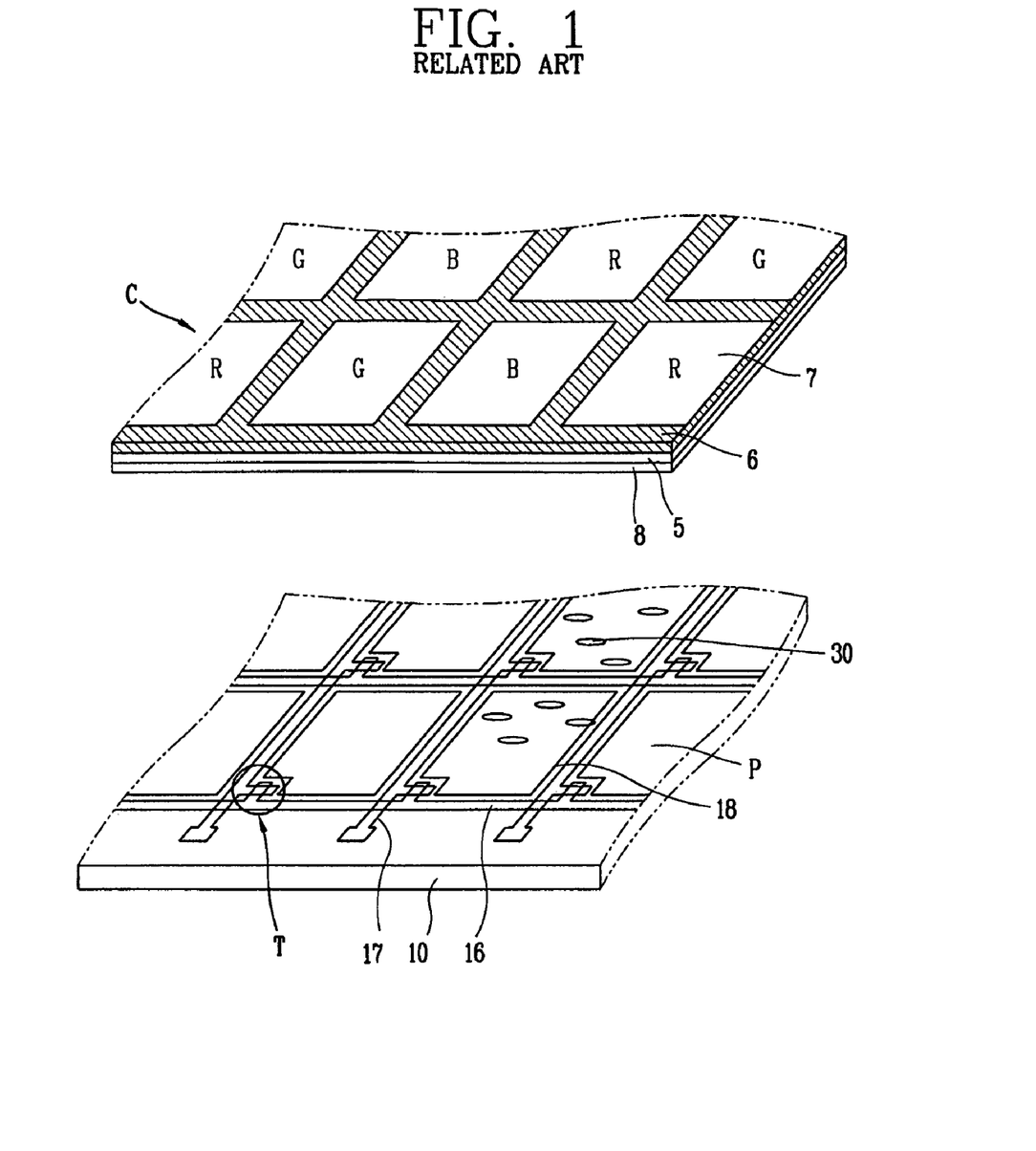
FIG. 1 is an exploded perspective view showing a related art liquid crystal display (LCD)

FIG. 1 is an exploded perspective view showing an LCD device of the related art.

As shown in FIG. 1, the LCD includes a color filter substrate 5, an array substrate 10 and a liquid crystal layer 30 formed between the color filter substrate 5 and the array substrate 10.

The color filter substrate 5 includes a color filter (C) including a plurality of sub-color filters 7 that implement red, green and blue colors, a black matrix 6 for dividing the sub-color filters 7 and blocking light transmission through the liquid crystal layer 30, and a transparent common electrode 8 for applying voltage to the liquid crystal layer 30.

The array substrate 10 includes gate lines 16 and data lines 17 which are arranged vertically and horizontally to define a plurality of pixel regions (P), TFTs as switching elements, are formed at respective crossings of the gate lines 16 and the data lines 17, and pixel electrodes 18 are formed on the pixel regions (P).

The color filter substrate 5 and the array substrate 10 are attached in a facing manner by a sealant (not shown) formed at an edge of an image display region to form a liquid crystal panel, and the attachment of the color filter substrate 5 and the array substrate 10 is made by an attachment key formed on the color filter substrate 5 or the array substrate 10.

FIGS. 2A to 2E are cross-sectional views sequentially showing a fabrication process of the related art array substrate of the LCD in FIG. 1.

Figure 2A:
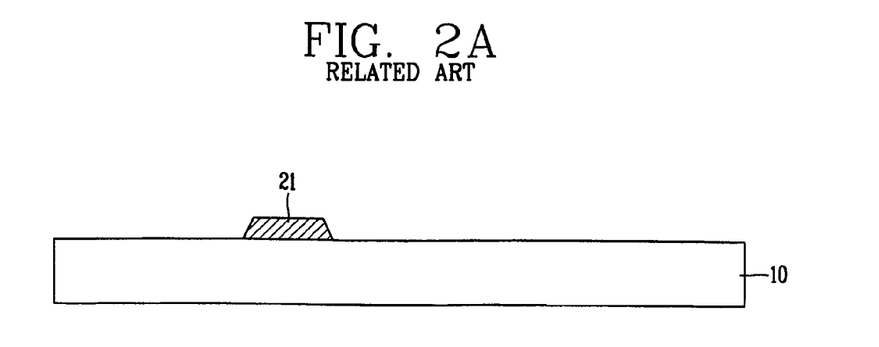
FIGS. 2A to 2E are cross-sectional views sequentially showing a fabrication process of a related art array substrate of the LCD in FIG. 1.

As shown in FIG. 2A, a gate electrode 21 made of a conductive material is formed by using a photolithography process (a first masking process) on a substrate.

Figure 2B:
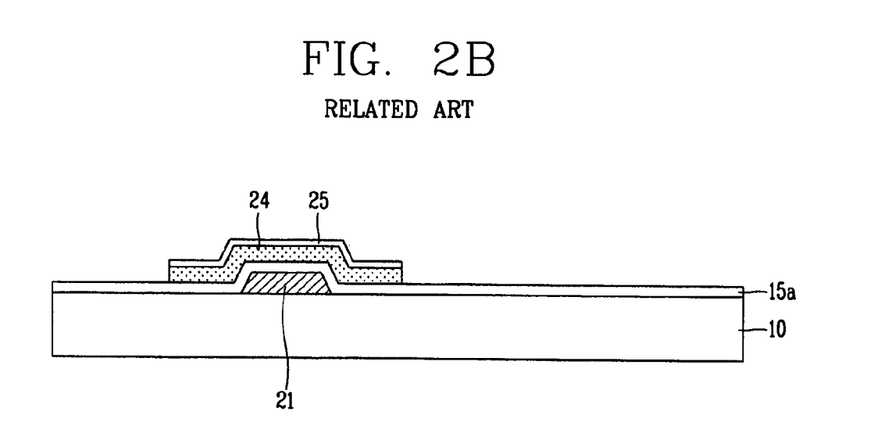

Next, as shown in 2B, a first insulation film 15a, an amorphous silicon thin film and an n+ amorphous silicon thin film are sequentially deposited over the entire surface of the substrate 10 with the gate electrode 21 formed thereon, and the amorphous silicon thin film and the n+ amorphous silicon thin film are selectively patterned by using the photolithography process (a second masking process) to form an active pattern 24 formed of the amorphous silicon thin film on the gate electrode 21.

In this case, the n+ amorphous silicon thin film pattern 25 which has been patterned in the same form as the active pattern 24 is formed on the active pattern 24.

Figure 2C:
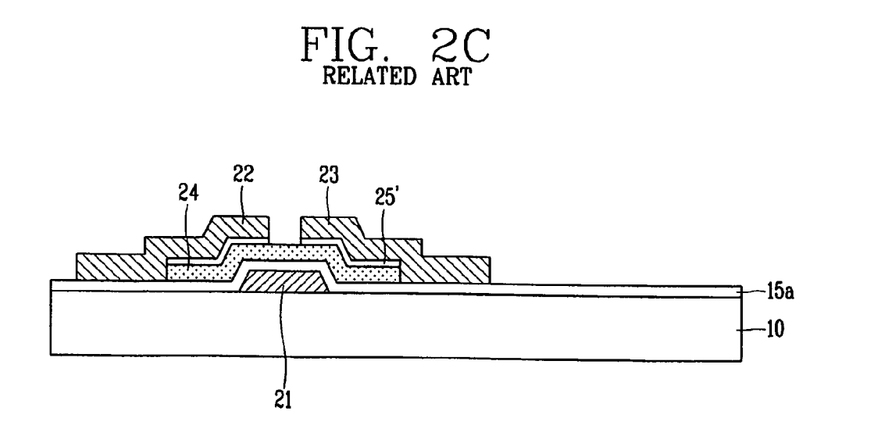

Thereafter, as shown in FIG. 2C, a conductive metal material is deposited over the entire surface of the array substrate 10 and then selectively patterned by using the photolithography process (a third masking process) to form a source electrode 22 and a drain electrode 23 made of the conductive metal material at an upper portion of the active pattern 24. At this time, a certain portion of the n+ amorphous silicon thin film pattern formed on the active pattern 24 is removed through the third masking process to form an ohmic-contact layer 25' between the active pattern 24 and the source and drain electrodes 22 and 23.

Figure 2D:
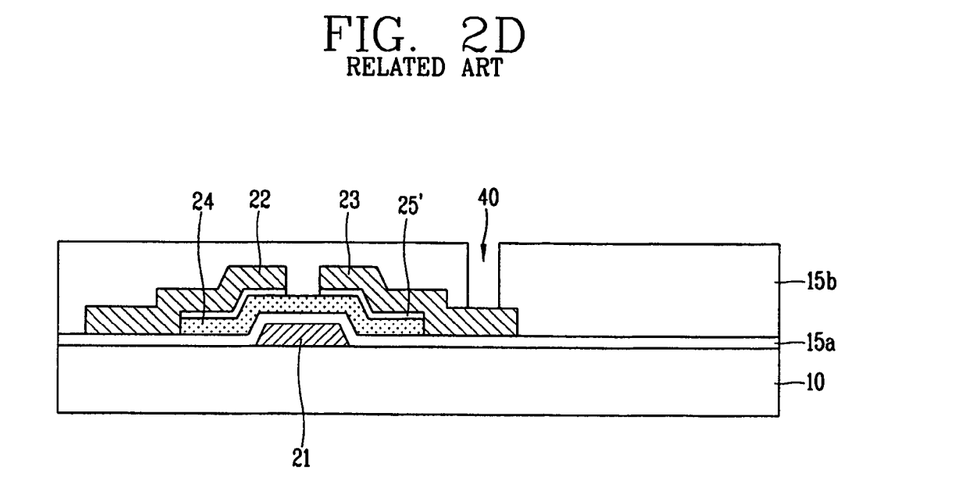

Subsequently, as shown in FIG. 2D, a second insulation film 15b is deposited over the entire surface of the array substrate 10 with the source electrode 22 and the drain electrode 23 formed thereon, and a portion of the second insulation film 15b is removed through the photolithography process (a fourth masking process) to form a contact hole 40 exposing a portion of the drain electrode 23.

Figure 2E:
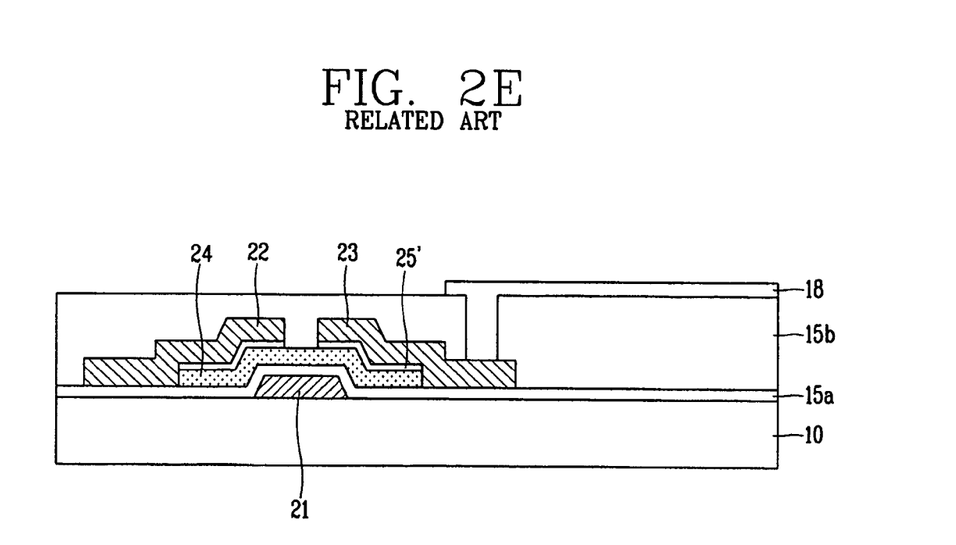

As shown in FIG. 2E, a transparent conductive metal material is deposited over the entire surface of the array substrate 10 and then selectively patterned by using the photolithography process (a fifth making process) to form a pixel electrode 18 made of the transparent conductive metal material electrically connected with the drain electrode 23 via the contact hole 40.

As mentioned above, in fabricating the array substrate including TFTs, according to the related art, a total of five photolithography processes are necessarily performed to pattern the gate electrode, the active pattern, the source and drain electrodes, the contact hole and the pixel electrode.

A photolithography process is a process of transferring a pattern formed on a mask onto the substrate on which a thin film is deposited to form a desired pattern, which includes a plurality of processes such as a process of coating a photosensitive solution, an exposing process and a developing process, etc., resulting in a reduction of production yield.

In particular, because the masks designed for forming the pattern(s) are quite expensive, as the number of masks used in the processes increases, the fabrication cost of the LCD increases proportionally.

SUMMARY OF THE INVENTION

Accordingly, embodiments of the invention are directed to a liquid crystal display (LCD) and its fabrication method that substantially obviates one or more of the problems due to limitations and disadvantages of the related art.

An advantage of the embodiments of the invention is to provide a liquid crystal display (LCD) and its fabrication method capable of reducing an OFF current and improving reliability of the device by forming an active pattern as an island and employing an etch stopper structure.

Another advantage of the embodiments of the invention is to provide an LCD and its fabrication method capable of fabricating an array substrate by performing masking processes four times by which an active pattern and a gate electrode are formed by a single masking process and an etch stopper is formed without additionally performing a masking process.

Additional features and advantages of embodiments of the invention will be set forth in the description which follows, and in part will be apparent from the description, or may be learned by practice of embodiments of the invention. These and other advantages of the embodiments of the invention will be realized and attained by the structure particularly pointed out in the written description and claims thereof as well as the appended drawings.

To achieve these and other advantages and in accordance with the purpose of embodiments of the invention, as embodied and broadly described herein, a liquid crystal display (LCD) includes: a first substrate divided into a pixel part and first and second pad parts; a gate electrode and a gate line formed at the pixel part of the first substrate; an active pattern formed as an island on the gate electrode and having a width smaller than the gate electrode; an insulation film formed on the first substrate and having first and second contact holes exposing source and drain regions of the active pattern, respectively; source and drain electrodes formed at the pixel part of the first substrate and electrically connected with the source and drain regions of the active pattern via the first and second contact holes; a data line formed at the pixel part of the first substrate and crossing the gate line to define a pixel region; an etch stopper positioned between the source and drain electrodes and formed as an insulation film; a pixel electrode electrically connected with the drain electrode; and a second substrate attached with the first substrate in a facing manner.

To achieve these and other advantages and in accordance with the purpose of embodiments of the invention, as embodied and broadly described herein, a method for fabricating an LCD includes: providing a first substrate divided into a pixel part and first and second pad parts; forming a gate electrode and a gate line at the pixel part of the first substrate and forming an active pattern as an island on the gate electrode; forming an insulation film on the first substrate; removing a portion of the insulation film to form first and second contact holes exposing source and drain regions of the active pattern and forming an etch stopper formed of a first insulation film on the active pattern between the source and drain regions; forming source and drain electrodes electrically connected with the source and drain regions of the active pattern via the first and second contact holes, and forming a data line crossing the gate line to define a pixel region; forming a pixel electrode electrically connected with the drain electrode; and attaching the first and second substrates.

It is to be understood that both the foregoing general description and the following detailed description are exemplary and explanatory and are intended to provide further explanation of embodiments as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF ILLUSTRATED EMBODIMENTS

The liquid crystal display (LCD) and its fabrication method will now be described in detail with reference to the accompanying drawings.

Figure 3:
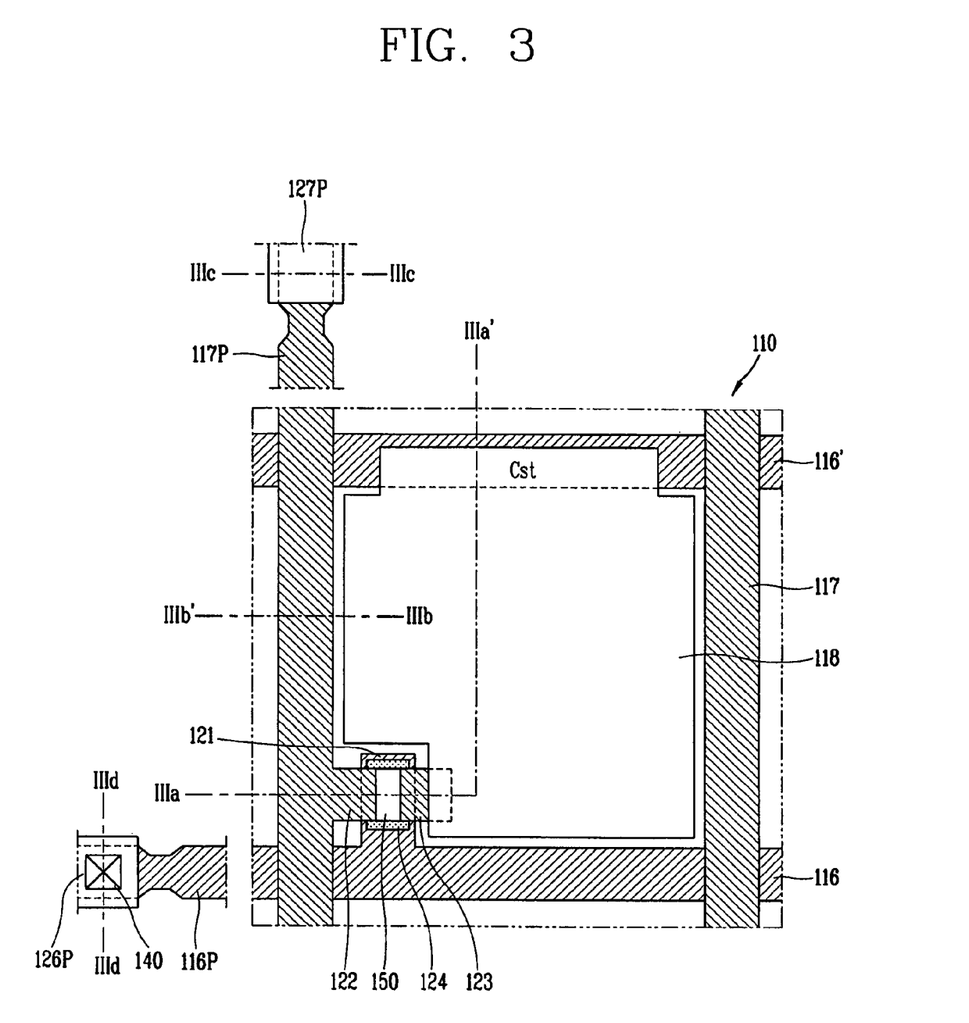
FIG. 3 is a plan view showing a portion of an array substrate of an LCD according to a first embodiment of the present invention.

FIG. 3 is a plan view showing a portion of an array substrate of an LCD according to a first embodiment of the present invention, in which a single pixel including a gate pad part and a data pad part are shown for the sake of explanation.

Actually, the "N" number of gate lines and the "M" number of data lines are formed to cross each other to define the "M×N" number of pixels. To simplify explanation, only a single pixel is shown.

As shown in FIG. 3, gate lines 116 and the data lines 117 are formed to be arranged vertically and horizontally to define the pixel region on an array substrate 110. A thin film transistor (TFT) as a switching element, is formed at a crossing of the gate line 116 and the data line 117. A pixel electrode 118 is formed within the pixel region, and is connected with the TFT to drive liquid crystal molecules (not shown) together with a common electrode of a color filter substrate (not shown).

A gate pad electrode 126p and a data pad electrode 127p are formed at edge portions of the array substrate 110 and electrically connected with the gate line 116 and the data line 117, and transfer a scan signal and a data signal applied from an external driving circuit unit (not shown) to the gate line 116 and the data line 117, respectively.

Namely, the gate line 116 and the data line 117 extend to the driving circuit unit so as to be connected with the corresponding gate pad line 116p and the data pad line 117p, and the gate pad line 116p and the data pad line 117p receive the scan signal and the data signal from a driving circuit unit through the gate pad electrode 126p and the data pad electrode 127p electrically connected with the gate pad line 116p and the data pad line 117p.

The TFT includes a gate electrode 121 connected with the gate line 116, a source electrode 122 connected with the data line 117, and a drain electrode 123 connected with the pixel electrode 118. The TFT also includes an active pattern 124 for forming a conductive channel between the source and drain electrodes 122 and 123 by a gate voltage supplied to the gate electrode 121.

Upper parts of the source electrode 122 and the drain electrode 123 are made of an opaque conductive material. Further, a source electrode pattern (not shown) and a drain electrode pattern (not shown) made of a transparent conductive material are respectively patterned in the same form as the source electrode 122 and the drain electrode 123.

A portion of the source electrode 122 extends in one direction to form a portion of the data line 117, and a portion of the drain electrode pattern extends to the pixel region to form the pixel electrode 118.

In embodiments of the present invention, the active pattern 124 is formed of an amorphous silicon thin film and is formed as an island over the gate electrode 121 within boundaries defined by the perimeter of the gate electrode 121 to thus reduce an off current of the TFT. The active pattern 124 and the gate electrode 121 are formed through a single masking process by using a diffraction (slit) mask or a half-tone mask (hereinafter, it is assumed that when the half-tone mask is referred to, it also includes the diffraction mask), thus saving one time of masking process in fabricating the array substrate 110.

In addition, an etch stopper 150 formed of an insulation film is formed between the source and drain electrodes 122 and 123 where a back channel is exposed in order to prevent contamination of the back channel of the active pattern 124.

A portion of the previous gate line 116' overlaps with a portion of the pixel electrode 118 with a second insulation film (not shown) interposed therebetween to form a storage capacitor Cst. The storage capacitor Cst serves to uniformly maintain voltage applied to a liquid crystal capacitor until a next signal is received. Namely, the pixel electrode 118 of the array substrate 110 forms the liquid crystal capacitor together with the common electrode of the color filter substrate. However, sometimes, the voltage applied to the liquid crystal capacitor is not maintained until the next signal is received but rather leaked. Thus, in order to maintain the applied voltage, the storage capacitor Cst should be connected with the liquid crystal capacitor for its use.

Besides maintaining the signal, the storage capacitor may also have the effect of stabilizing a gray scale representation, reducing flickering effects, and reducing the formation of residual images, for example.

In the LCD according to the embodiment of the present invention, the gate electrode 121 and the active pattern 124 are simultaneously formed through the single masking process using the slit mask, and the etch stopper 150 for protecting the back channel is formed without performing any additional masking process. Thus, the array substrate 110 is fabricated by performing the masking process a total of four times. This will now be described in detail.

FIGS. 4A to 4D are cross-sectional views sequentially showing a fabrication process of the array substrate in FIG. 3. The left side shows the process of fabricating the array substrate of the pixel part and the right side shows the sequential process of fabricating the array substrate of the data line part, the data pad part and the gate pad part.

FIGS. 5A to 5D are plan views sequentially showing the fabrication process of the array substrate in FIG. 3.

Figure 4A:
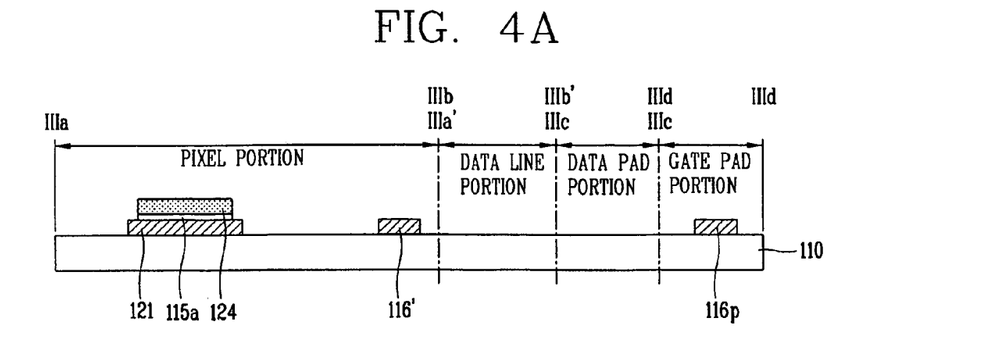
FIGS. 4A to 4D are cross-sectional views sequentially showing a fabrication process taken along lines IIIa-IIIa', IIIb-IIIb' and IIIc-IIIc' of the array substrate in FIG. 3.
Figure 5A:
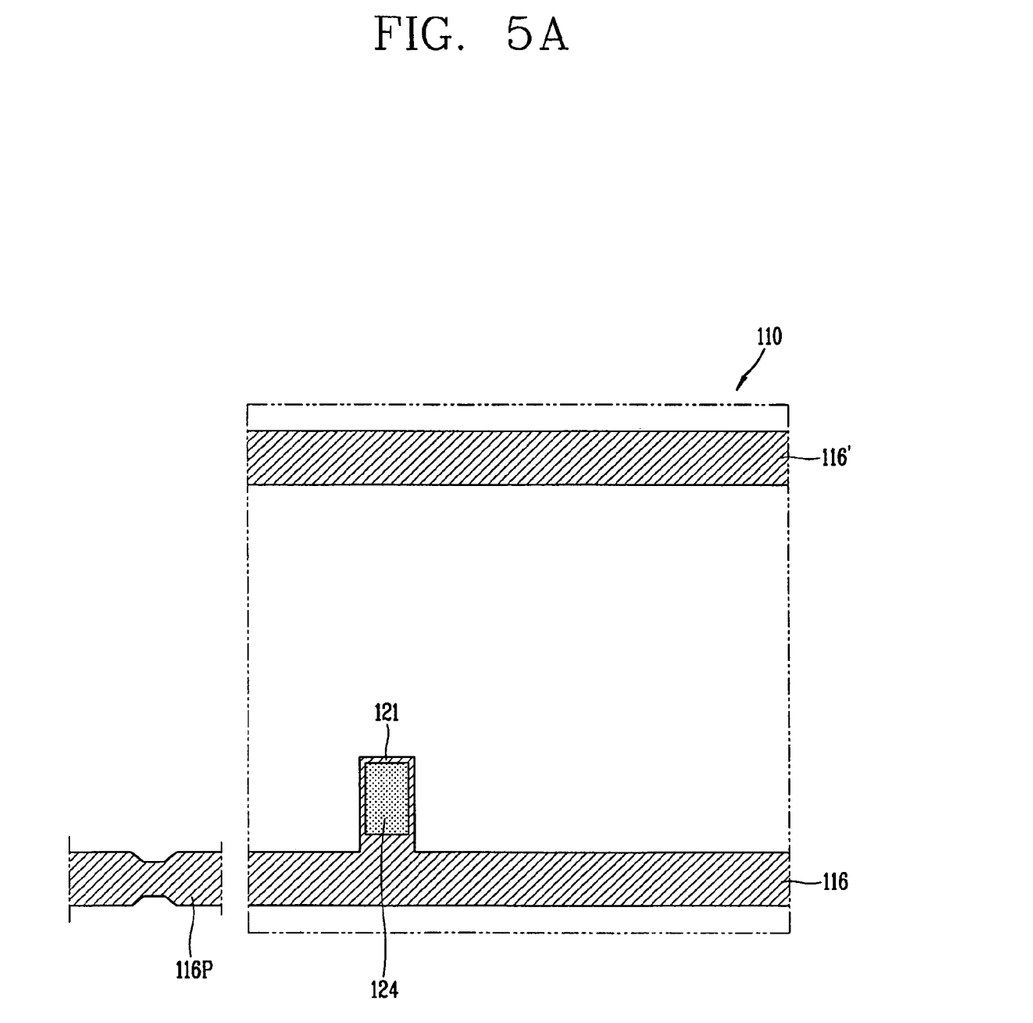
FIGS. 5A to 5D are plan views sequentially showing the fabrication process of the array substrate in FIG. 3.

As shown in FIGS. 4A and 5A, the gate electrode 121 and gate lines 116 and 116' on the pixel part of the array substrate 110 made of the transparent insulation material such as glass, and the gate pad line 116*p* is formed on the gate pad part of the array substrate 110.

Reference numeral 116' refers to the previous gate line with respect to a corresponding pixel, and the gate line 116 of the corresponding pixel and the previous gate line 116' are formed in the same manner.

In the embodiment of the present invention, the active pattern 124 is formed as an island at the upper portion of the gate electrode 121 with the first insulation film 115*a* interposed therebetween. The gate electrode 121, the gate lines 116 and 116', the gate pad line 116*p* and the active pattern 124 are formed by depositing a first conductive film, a first insulation film and an amorphous silicon thin film over the entire surface of the array substrate 110 and then patterning them through the photolithography process (a first masking process).

In this manner, in the embodiment of the present invention, the gate electrode 121, the gate lines 116 and 116', the gate pad line 116*p* and the active pattern 124 are simultaneously formed by using the slit mask. The first masking process will now be described in detail with reference to the accompanying drawings.

FIGS. 6A to 6F are cross-sectional views showing the first masking process in detail in FIGS. 4A and 5A.

Figure 6A:
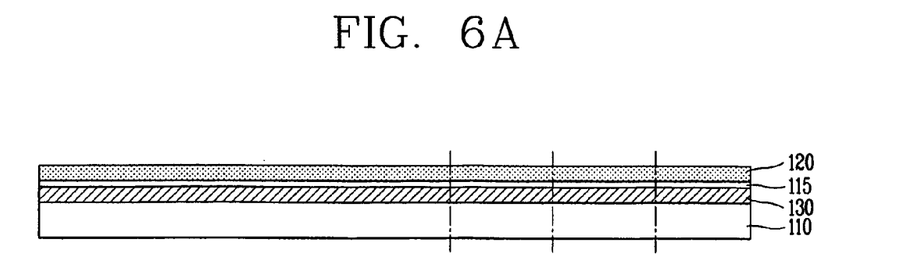
FIGS. 6A to 6F are cross-sectional views substantially showing a first masking process in FIGS. 4A and 5A.

As shown in FIG. 6A, a first conductive film 130, a first insulation film 115 and an amorphous silicon thin film 120 are sequentially deposited over the entire surface of the array substrate 110 made of a transparent insulation material such as glass or other suitable material.

Here, the first conductive film 130 can be made of a low-resistance opaque conductive material such as aluminum (Al), an aluminum alloy, tungsten (W), copper (Cu), chromium (Cr), molybdenum (Mo), or other suitable material. Also, the first conductive film 130 may be formed with a multi-layered structure by stacking two or more low-resistance conductive materials, for example.

Figure 6B:
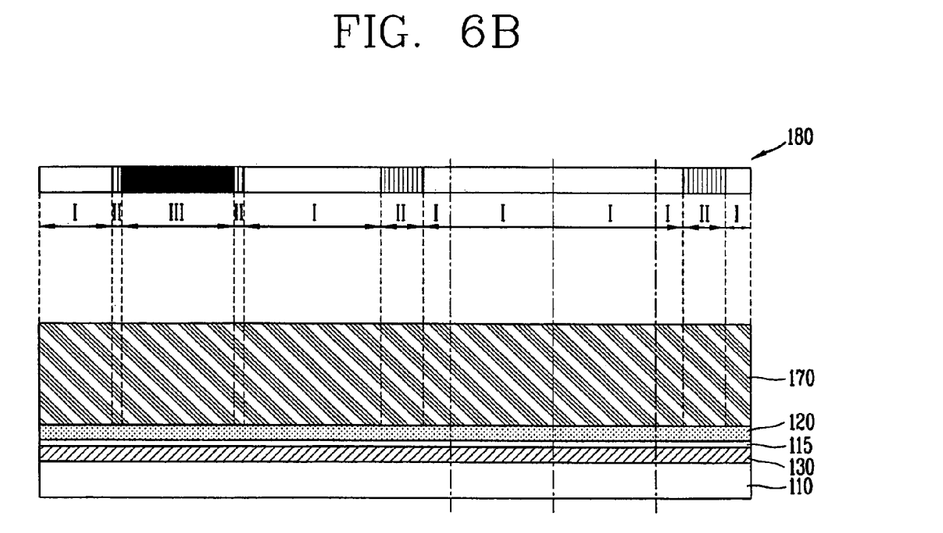

Thereafter, as shown in FIG. 6B, a photosensitive film 170 made of a photosensitive material such as photoresist is formed over the entire surface of the array substrate 110, on which light is selectively irradiated through the slit mask 180.

The slit mask 180 includes a first transmission region (I) that allows irradiated light to be entirely transmitted therethrough, a second transmission region (II) that allows only light to be partially transmitted therethrough while blocking the remaining light, and a blocking region (III) that entirely blocks the irradiated light. Only light which has transmitted through the half-tone mask 180 can be irradiated on the photosensitive film 170.

Figure 6C:
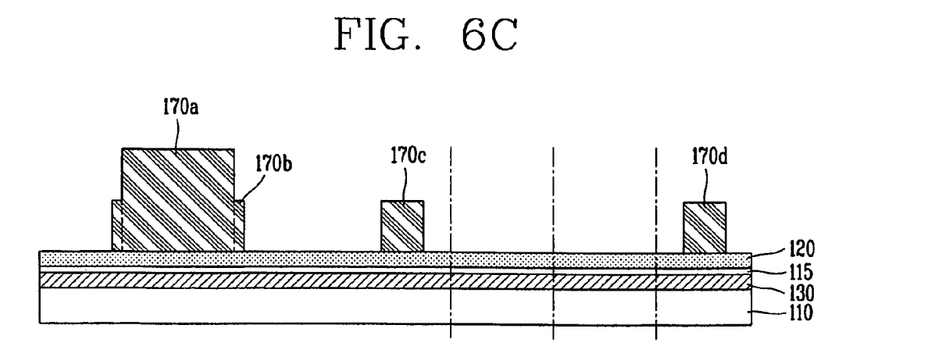

Subsequently, when the photosensitive film 170 which has been exposed through the slit mask 180 is developed, as shown in FIG. 6C, first and second photosensitive film patterns 170*a* to 170*d* remain at regions where light has been entirely blocked or partially blocked through the blocking region (III) and the slit region (II), and the photosensitive film at the transmission region (I) through which light had been entirely transmitted has been completely removed to expose the surface of the amorphous silicon thin film 120.

At this time, the first photosensitive film pattern 170*a* formed at the blocking region III is thicker than the second to fourth photosensitive film patterns 170*b* to 170*d* formed through the slit region II. In addition, the photosensitive film at the region where the light had entirely transmitted through the first transmission region I has been completely removed. This is because positive photoresist has been used, but without being limited thereto, negative photoresist can be also used in the present invention.

Figure 6D:
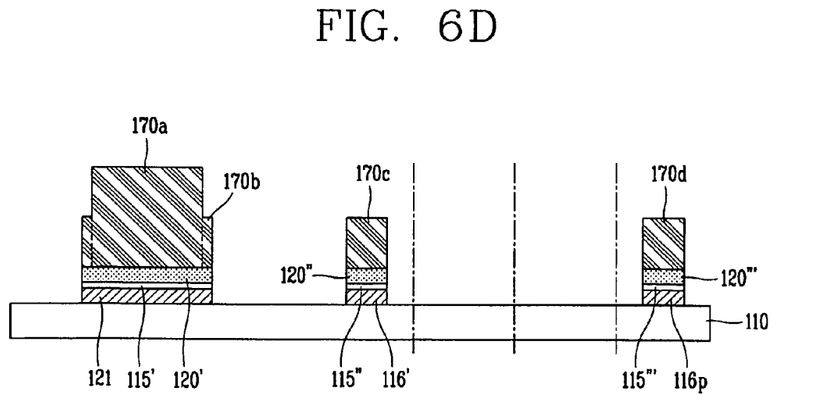

Thereafter, as shown in FIG. 6D, the lower first conductive film, the first insulation film and the amorphous silicon thin film are selectively removed by using the photosensitive film patterns 170*a* to 170*d* as masks to form the gate electrode and the gate lines 116 and 116' formed of the first conductive film at the pixel part of the array substrate 110, and the gate pad line 116*p* formed of the first conductive film at the gate pad part of the array substrate 110.

Then, a pixel part amorphous silicon thin film pattern 120', a gate line part amorphous silicon thin film pattern 120" and a pad part amorphous silicon thin film pattern 120''', which are formed of the amorphous silicon thin film and have been patterned in the same form as the gate electrode 121, the gate lines 116 and 116' and the gate pad line 116p, remain at upper portions of the gate electrode 121, the gate lines 116 and 116', and the gate pad line 116p.

A pixel part first insulation film pattern 115', a gate line part first insulation film pattern 115" and a pad part first insulation film pattern 115''', which are formed of the first insulation film and have been patterned in the same form as the gate electrode 121, the gate lines 116 and 116' and the gate pad line 116p, are interposed between the gate electrode 121, the gate lines 116 and 116' and the gate pad line 116p, and the pixel part amorphous silicon thin film pattern 120', the gate line part amorphous silicon thin film pattern 120" and the pad part amorphous silicon thin film pattern 120'''.

Figure 6E:
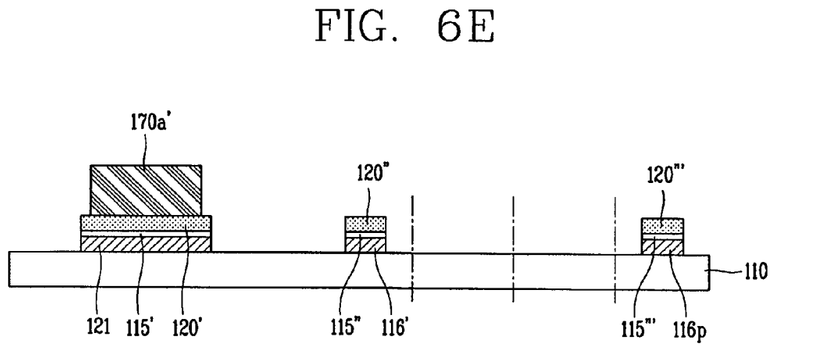

Thereafter, an ashing process is performed to remove a portion of the first photosensitive film patterns 170a to 170d. Then, as shown in FIG. 6E, the second to fourth photosensitive film patterns of the slit region II have been completely removed, to which the slit exposure was applied to expose surfaces of portions of the pixel part amorphous silicon thin film pattern 120', the gate line part amorphous silicon thin film pattern 120" and the pad part amorphous silicon thin film pattern 120'''.

In this case, the first photosensitive film pattern remains as a fifth photosensitive film pattern 170a' by removing the thickness of the second to fourth photosensitive film patterns only at a certain region corresponding to the blocking region III.

Figure 6F:
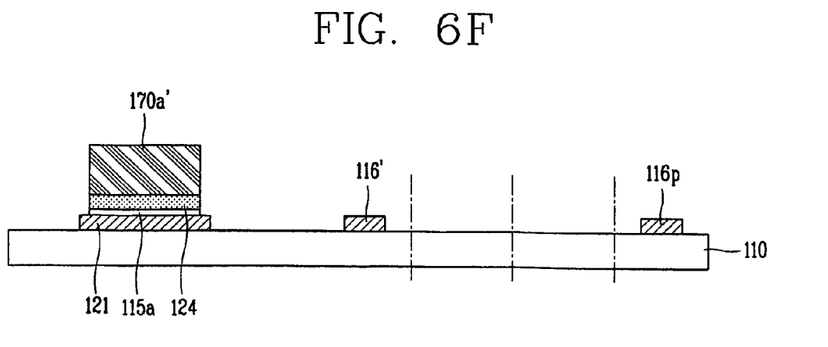

Thereafter, as shown in FIG. 6F, portions of the pixel part first insulation film pattern and the pixel part amorphous silicon thin film pattern are removed by using the remaining fifth photosensitive film pattern 170a' as a mask to form the gate insulation film 115a and the active pattern 124 formed of the amorphous silicon thin film. At this time, the remaining gate line part amorphous silicon thin film pattern, the pad part amorphous silicon thin film pattern, the gate line part first insulation film pattern, and the pad part first insulation film pattern are removed to expose the surfaces of the gate lines 116 and 116' and the gate pad line 116p.

In this manner, in the embodiment of the present invention, the gate electrode 121, the gate lines 116 and 116', the gate pad line 116p and the active pattern 124 can be formed through the single masking process by using the slit mask. Thus, the number of masks used for fabricating the TFT can be reduced, and thus, the fabrication process and cost can be reduced and production yield can be improved.

In addition, because the active pattern 124 is formed as an island over the gate electrode 121 and within boundaries defined by the perimeter of the gate electrode, the off current of the TFT can be reduced.

Figure 4B:
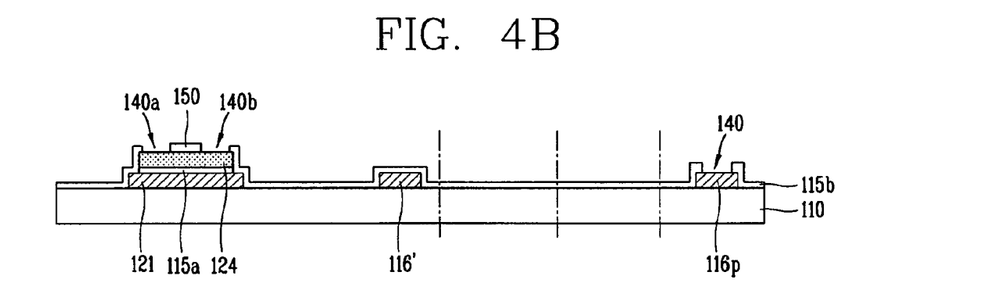
Figure 5B:
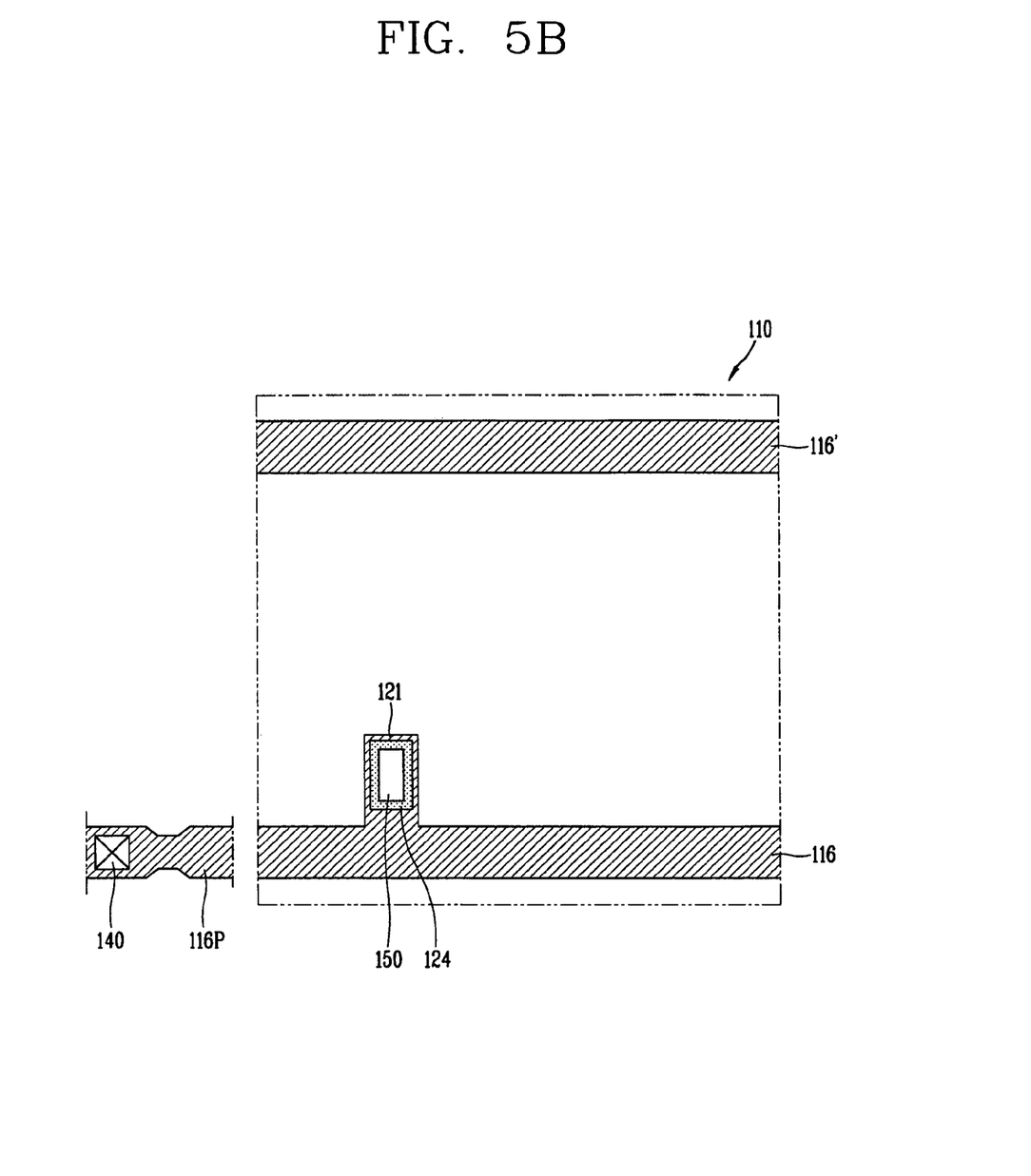

Next, as shown in FIGS. 4B and 5B, a second insulation film 115b is deposited over the entire surface of the array substrate 110 on which the gate electrode 121, the gate lines 116 and 116', the gate pad line 116p and the active pattern 124 have been formed, and a portion of the second insulation film 115b is removed by using photolithography (a second masking process) to form a first contact hole 140a and a second contact hole 140b exposing certain regions (i.e., source and drain regions) of the active pattern 124 and a pad hole 140 exposing a portion of the gate pad line 116p.

At this time, the second insulation film positioned at the region of the back channel of the active pattern 124 remains to form the etch stopper 150.

In the LCD according to the embodiment of the present invention, because the etch stopper 150 is formed to prevent the back channel of the active pattern 124 from being exposed to thus protect the back channel, the thickness of the active pattern 124 can be relatively thin and contamination of the back channel of the active pattern 124 can be prevented. Consequently, the gate insulation film 115a can be formed to be thin, so a driving voltage and a threshold voltage of the TFT can be substantially lowered.

Figure 4C:
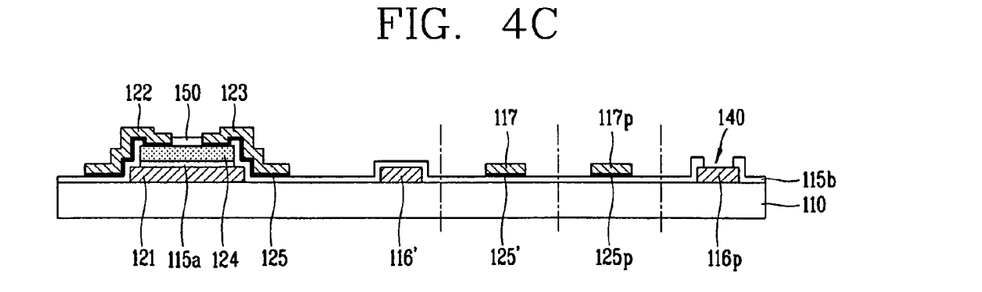
Figure 5C:
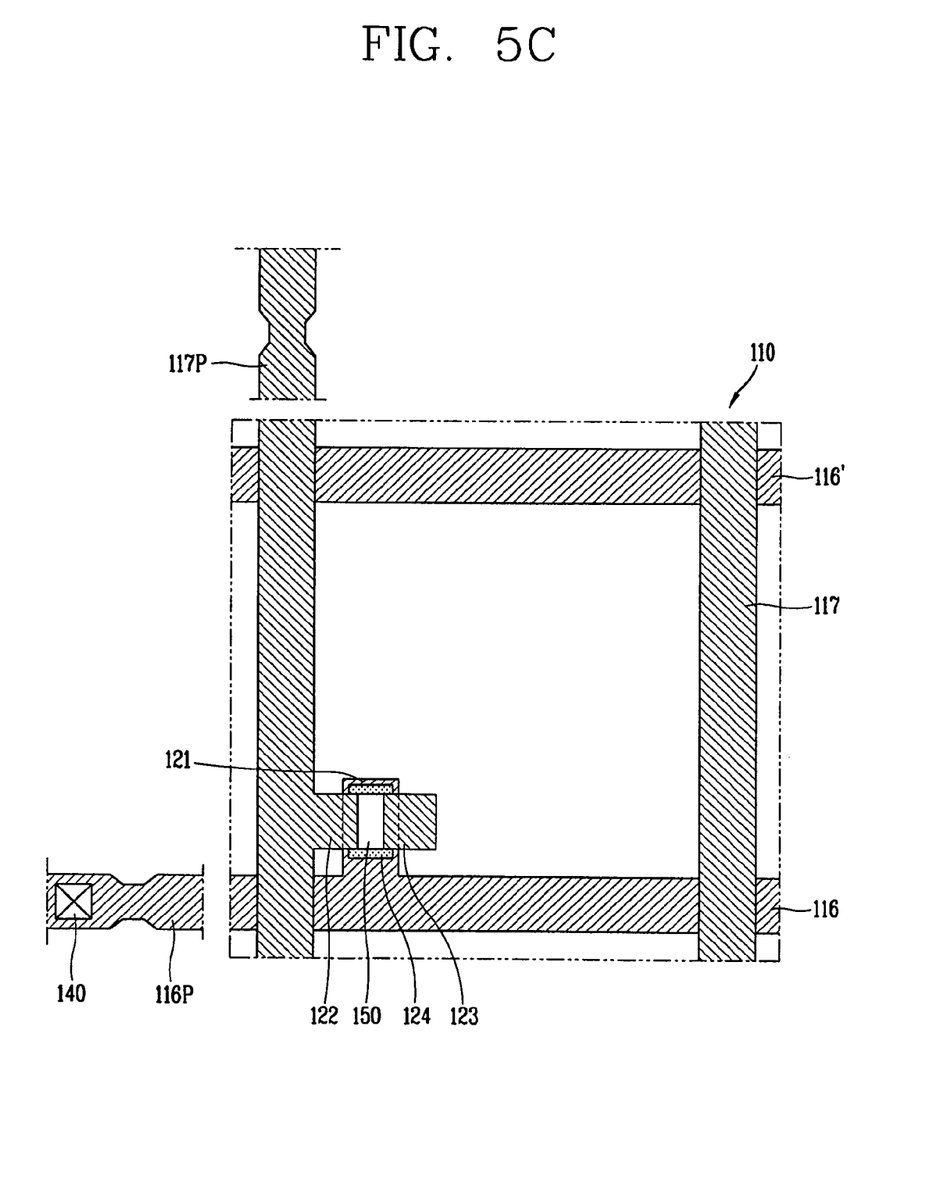

With reference to FIGS. 4C and 5C, after an n+ amorphous silicon thin film and a second conductive film are formed over the entire surface of the array substrate 110 and then selectively patterned by using the photolithography process (a third masking process to form the source electrode electrically connected with the source region via the first contact hole and the drain electrode 123 electrically connected with the drain electrode via the second contact hole.

At this time, an ohmic-contact layer 125, which is formed of the n+ amorphous silicon thin film and has been patterned in the same form as the source and drain electrodes 122 and 123 to allow the source drain regions of the lower active pattern 124 and the source and drain electrodes 122 and 123 to ohmic-contact, is formed on the active pattern 124.

A data pad line 117p formed of the second conductive film is formed on the array substrate 110 of the data pad part through the third masking process, and a pad part n+ amorphous silicon thin film pattern 125p, which is formed of the n+ amorphous silicon thin film and has been patterned in the same form as the data pad line 117p, remains at a lower portion of the data pad line 117p In this case, a portion of the source electrode 122 of the pixel part extends in a direction to constitute a portion of the data line 117, and a data line part n+ amorphous silicon thin film pattern 125' formed on the n+ amorphous silicon thin film is patterned in the same form as the data line 117 and remains at a lower portion of the data line 117.

Here, in the embodiment of the present invention, the data line does not have a tail of the active pattern formed of the amorphous silicon thin film at a lower portion thereof, so there is no signal interference to the data line 117 due to the tail of the active pattern. For reference, the tail of the active pattern is formed at a lower portion of the data line in the process of forming the active pattern, the source and drain electrodes and the data line through the single masking process by using the slit mask. Having a width larger than that of the data line, the tail causes signal interference of the data line and degradation of an aperture ratio.

In order to form the source and drain electrodes 122 and 123, the data line 117 and the data pad line 117p, the second conductive film may be made of the low-resistance opaque conductive material such as aluminum (Al), an aluminum alloy, tungsten (W), copper (Cu), chromium (Cr), molybdenum (Mo), or other suitable material.

Figure 4D:
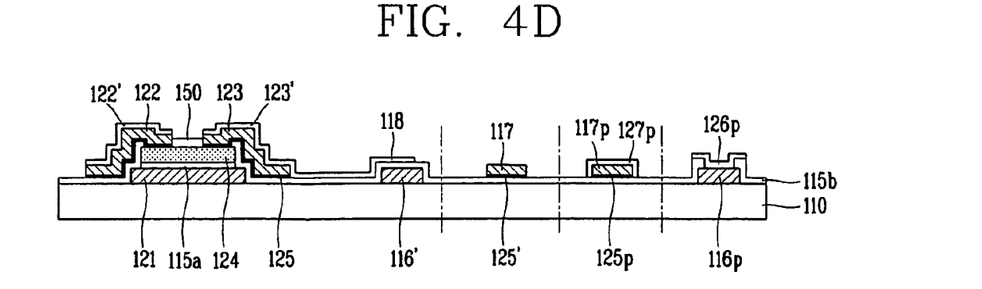
Figure 5D:
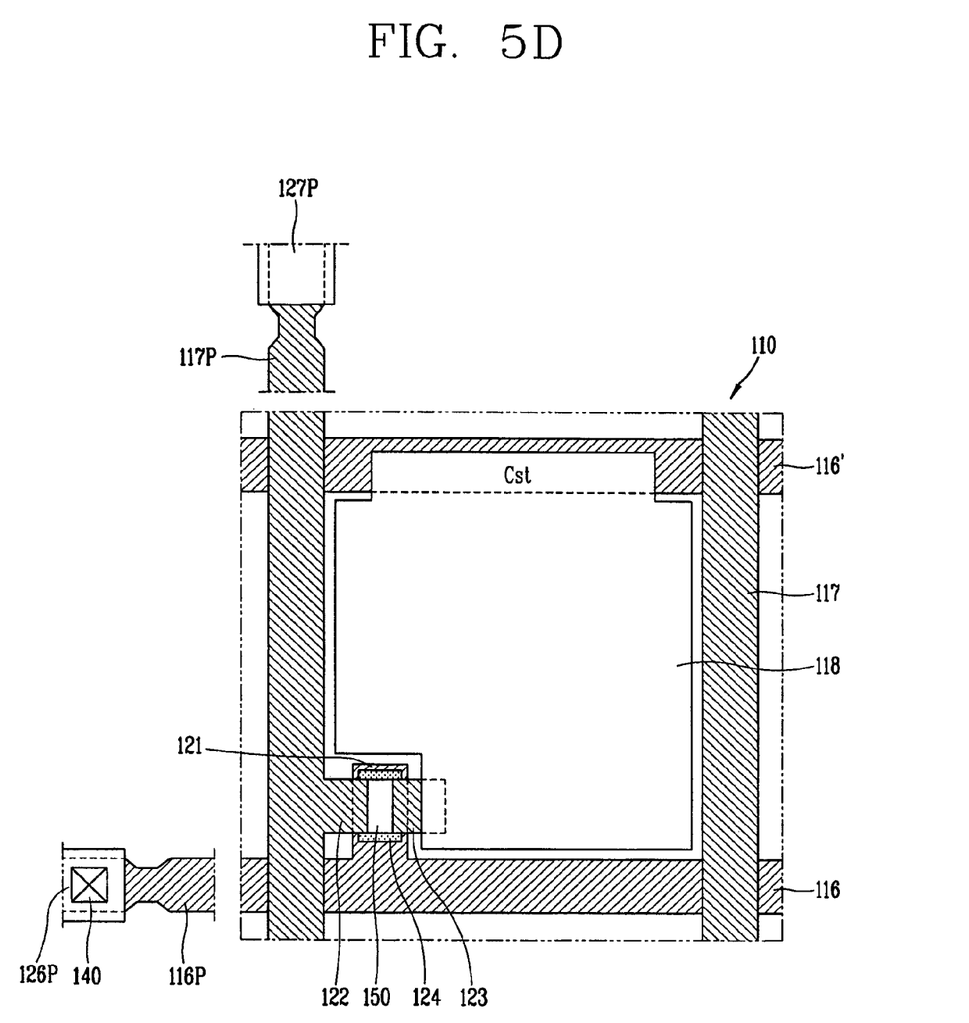

Subsequently, as shown in FIGS. 4D and 5D, a third conductive film is formed over the entire surface of the array substrate 110 and selectively patterned through the photolithography process (a fourth masking process) to form the pixel electrode 118 electrically connected with the drain electrode 123 and simultaneously form the gate pad electrode 126p and the data pad electrode 127p electrically connected with the gate pad line 116p and the data pad line 117p and exposing them.

At this time, the source electrode pattern 122' and the drain electrode pattern 123', which are formed of the third conductive film and have been patterned in the same form as the source electrode 122 and the drain electrode 123, may be formed on the source electrode 122 and the drain electrode 123, and a portion of the drain electrode pattern 123' extends to the pixel region to form the pixel electrode 118.

The pixel electrode 118 and the data pad electrode 127p are directly and electrically connected with the lower drain electrode 123 and the data pad line 117p, and the gate pad electrode 126p is electrically connected with the lower gate pad line 116p via the pad hole.

In addition, a portion of the corresponding pixel electrode 118 is formed to overlap with a portion of the previous gate line 116' to form a storage capacitor Cst together with the previous gate line 116' with the second insulation film 115b interposed therebetween.

In order to form the pixel electrode 118, the gate pad electrode 126p and the data pad electrode 127p, the third conductive film may be made of a transparent conductive material with good transmittance such as indium tin oxide (ITO) or indium-zinc-oxide (IZO).

The array substrate according to the embodiment of the present invention is attached with a color filter substrate in a facing manner by a sealant applied to outer edges of the image display part. In this case, the color filter substrate includes black matrices for preventing leakage of light to the TFTs, the gate lines and the data lines and color filters for implementing red, green and blue colors.

The attachment of the color filter substrate and the array substrate are made through attachment keys formed on the color filter substrate or the array substrate.

In the embodiment of the present invention, as the active patterns, the amorphous silicon TFT using the amorphous silicon thin film is used as an example, but the present invention is not limited thereto and as the active patterns, polycrystalline silicon TFTs using a polycrystalline silicon thin film can be also used.

The present invention can be also applied to a different display device fabricated by using TFTs, for example, an OLED (Organic Light Emitting Diode) display device in which OLEDs are connected with driving transistors.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

What is claimed is:

1. A thin film transistor liquid crystal display (LCD) device comprising:
a first substrate divided into a pixel part and first and second pad parts;
a gate electrode and a gate line formed at the pixel part of the first substrate, wherein the gate electrode includes a top surface divided into a first region and a second region;
an active pattern as an island formed only on the first region of the top surface of the gate electrode, wherein the active pattern includes a top surface having a width smaller than that of the top surface of the gate electrode;
a first insulation film formed between the gate electrode and the active pattern, wherein the first insulation film includes a top surface having the same width as that of the top surface of the active pattern;
a second insulation film formed on the first substrate and having first and second contact holes exposing source and drain regions of the active pattern, respectively, wherein a portion of the said second insulation film is formed on the second region of the top surface of the gate electrode;
source and drain electrodes formed of an opaque conductive material at the pixel part of the first substrate and electrically connected with the source and drain regions of the active pattern via the first and second contact holes;
an ohmic-contact layer positioned at lower portions of the source and drain electrodes;
a data pad line formed of the opaque conductive material and formed on the second pad part of the first substrate;
source and drain electrode patterns formed of a transparent conductive material at upper parts of the source and drain electrodes, wherein the source and drain electrode patterns are respectively patterned in substantially the same form as the source and drain electrodes;
a data pad electrode formed of the transparent conductive material to cover the data pad line and electrically connected with the data pad line on the second pad part of the first substrate;
a data line formed at the pixel part of the first substrate and crossing the gate line to define a pixel region;
an etch stopper as an island positioned between the source and drain electrodes and formed as the second insulation film;
a pixel electrode electrically connected with the drain electrode, wherein a portion of the drain electrode pattern extends to the pixel region to form the pixel electrode; and
a second substrate attached with the first substrate in a facing manner.

2. The device of claim 1, further comprising
a gate pad line formed of a first conductive film that forms the gate electrode, and formed on the first pad part of the first substrate.

3. The device of claim 2, further comprising:
a gate pad electrode electrically connected with the gate pad line on the first pad part of the first substrate.

4. The device of claim 1, wherein the ohmic-contact layer is patterned in the same form as the source and drain electrodes to allow the source and drain regions and the source and drain electrodes to contact ohmically with each other.

5. The device of claim 1, wherein a portion of the pixel electrode overlaps with a portion of the gate line with the second insulation film interposed therebetween to form a storage capacitor.

6. The device of claim 1, further comprising:
an n+ amorphous silicon thin film pattern formed at a lower portion of the data line and patterned in the same form as the data line.

* * * * *